(12) United States Patent
Jang et al.

(10) Patent No.: US 7,375,975 B1
(45) Date of Patent: May 20, 2008

(54) ENHANCED DURABILITY MEMORY CARD

(75) Inventors: Sang Jae Jang, Gwangjin-gu (KR);
Chul Woo Park, Gangdong-gu (KR);
Choon Heung Lee, Gyeonggi-do (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/263,428

(22) Filed: Oct. 31, 2005

(51) Int. Cl.
*H05K 5/03* (2006.01)
*H05K 9/00* (2006.01)

(52) U.S. Cl. .............. 361/752; 361/737; 361/753; 361/799; 235/492

(58) Field of Classification Search .......... 361/737, 361/752, 753, 736, 728–730, 799; 174/520; 235/492
See application file for complete search history.

(56) References Cited

U.S. PATENT DOCUMENTS

| | | | |
|---|---|---|---|
| 3,668,299 A | 6/1972 | Mc Neal | |
| 4,532,419 A | 7/1985 | Takeda | |
| 4,905,124 A | 2/1990 | Banjo et al. | |
| 4,974,120 A | 11/1990 | Kodai et al. | |
| 5,172,214 A | 12/1992 | Casto | |
| 5,360,992 A | 11/1994 | Lowrey et al. | |
| 5,574,309 A | 11/1996 | Papaietro et al. | |
| 5,581,445 A * | 12/1996 | Horejs et al. | 361/737 |
| 5,673,179 A * | 9/1997 | Horejs et al. | 361/737 |
| 5,682,293 A * | 10/1997 | Horejs et al. | 361/737 |
| 5,682,294 A * | 10/1997 | Horejs et al. | 361/737 |
| 5,682,295 A * | 10/1997 | Horejs et al. | 361/737 |
| 5,682,296 A * | 10/1997 | Horejs et al. | 361/737 |
| 5,712,766 A * | 1/1998 | Feldman | 361/737 |
| 5,742,479 A * | 4/1998 | Asakura | 361/737 |
| 5,753,532 A | 5/1998 | Sim | |
| 5,784,259 A * | 7/1998 | Asakura | 361/752 |
| 5,789,280 A | 8/1998 | Yokota et al. | |
| 5,808,359 A | 9/1998 | Muto et al. | |
| 5,822,190 A | 10/1998 | Iwasaki | |
| 5,893,724 A | 4/1999 | Chakravorty et al. | |
| 5,912,806 A * | 6/1999 | Onoda et al. | 361/737 |
| 5,955,722 A * | 9/1999 | Kurz et al. | 235/479 |
| 6,040,622 A | 3/2000 | Wallace | |
| 6,143,981 A | 11/2000 | Glenn | |
| 6,144,563 A * | 11/2000 | Feldman et al. | 361/829 |
| D445,096 S | 7/2001 | Wallace | |
| D446,525 S | 8/2001 | Okamoto et al. | |
| 6,356,674 B1 * | 3/2002 | Davis et al. | 385/10 |
| 6,362,968 B1 * | 3/2002 | Lajara et al. | 361/752 |
| 6,376,283 B1 | 4/2002 | Chen | |
| 6,384,472 B1 | 5/2002 | Huang | |
| 6,390,375 B2 * | 5/2002 | Kayanakis | 235/492 |
| 6,456,504 B1 * | 9/2002 | LoForte et al. | 361/799 |

(Continued)

*Primary Examiner*—Jeremy C Norris
*Assistant Examiner*—Dameon E Levi
(74) *Attorney, Agent, or Firm*—Stetina Brunda Garred & Brucker

(57) ABSTRACT

In accordance with the present invention, there is provided multiple embodiments of a memory card, each embodiment including a case which is cooperatively engaged to a module comprising at least a printed circuit board having an electronic circuit device mounted thereto. In each embodiment of the present invention, the case is reinforced by a stiffener which effectively increases the mechanical strength of the fully fabricated memory card, thus providing the capability to withstand typical bending and twisting tests. The stiffener may be provided in any one of a plurality of different shapes or profiles, and may embedded within one or more of various locations within the case.

20 Claims, 8 Drawing Sheets

U.S. PATENT DOCUMENTS

| | | |
|---|---|---|
| 6,462,273 B1 | 10/2002 | Corisis et al. |
| 6,476,331 B1 | 11/2002 | Kim |
| 6,476,469 B2 | 11/2002 | Hung et al. |
| 6,483,038 B2 | 11/2002 | Lee et al. |
| 6,545,332 B2 | 4/2003 | Huang |
| 6,603,196 B2 | 8/2003 | Lee et al. |
| 6,624,005 B1 | 9/2003 | Di Caprio et al. |
| 7,109,427 B1 * | 9/2006 | Ng .............................. 174/521 |
| 2002/0140068 A1 | 10/2002 | Lee |
| 2004/0245674 A1 | 12/2004 | Yew et al. |
| 2005/0030723 A1 * | 2/2005 | Miks et al. ................. 361/752 |

* cited by examiner

ENHANCED DURABILITY MEMORY CARD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

The present invention relates generally to memory cards, and more particularly to a memory card (e.g., a multi-media card or secure digital card) which is manufactured to include an internal reinforcement structure adapted to provide increased mechanical strength to resist bending and twisting under a predetermined load, thus enhancing the durability of the memory card.

As is well known in the electronics industry, memory cards are being used in increasing numbers to provide memory storage and other electronic functions for devices such as digital cameras, MP3 players, cellular phones, and personal digital assistants. In this regard, memory cards are provided in various formats, including multi-media cards and secure digital cards.

Typically, memory cards include a module which itself comprises a printed circuit board (PCB) having a conductive wiring pattern disposed thereon. Attached to one side or surface of the PCB and electrically connected to the conductive pattern thereof is a plurality of electronic circuit devices, such as semiconductor packages, semiconductor dies, and/or passive elements. In most memory cards, these electronic circuit devices and a portion of the PCB are covered or encapsulated by an encapsulant material. The PCB also includes a plurality of input/output (I/O) pads disposed on the side or surface thereof opposite that having the electronic circuit devices thereon. These I/O pads are not covered by the encapsulant material, and thus are exposed in the completed module. Attached to the module is a skin or case of the memory card, such case generally defining the outer appearance of the memory card. The module is coupled to the case such that the I/O pads disposed on the PCB are not covered by the case, and thus remain exposed in the fully assembled memory card. These I/O pads of the memory card provide an external interface for an insertion point or socket. The completed memory card has a generally rectangular configuration, with most memory cards including a chamfer formed at one edge thereof which is adjacent to the I/O pads.

Memory cards as currently known can generally be sorted into two types based on the method used to mount the electronic circuit devices to the PCB during the fabrication of the memory card. The common categories include a surface mount technology (SMT) type memory card and a chip on board (COB) type memory card. In an SMT memory card, a semiconductor package (i.e., a semiconductor die which is already encapsulated in a package body of a hardened encapsulant material) is mounted and electrically connected to the PCB, and thereafter covered with the encapsulant material to form the above-described module. In a COB memory card, a semiconductor die is mounted and electrically connected to the PCB, and thereafter covered with the encapsulant material to form the above-described module. In the case of the COB memory card, the covering of the semiconductor die with the encapsulant material serves the dual purposes protecting the die and increasing the overall strength of the memory card. In the case of the SMT memory card, the covering of the semiconductor package with the encapsulant material is not primarily for the purpose of protecting the semiconductor package (which already includes a package body of a hardened encapsulant material), but rather for the purpose of increasing the overall strength of the memory card. Even in the COB memory card, the primary protection for the internal semiconductor die is provided by the case. Thus, in SMT memory cards and to a large extent in COB memory cards, the covering of the electronic circuit devices with the encapsulant material is for purposes of increasing the mechanical strength of the memory card, and not primarily for purposes of protecting such electronic circuit devices. As will be recognized, the added mechanical strength imparted to the memory card as a result of the inclusion of the hardened encapsulant material underneath the case makes the memory card less susceptible to bending or twisting under a predetermined load, thus allowing it to pass various mandated bending and twisting tests under predetermined conditions.

However, with particular regard to the SMT memory card wherein the encapsulant material is used only to impart increased mechanical strength to the memory card, the need to include the additional encapsulation step increases the number of manufacturing processes and hence the manufacturing cost for such memory card. Further, the need to include the encapsulant material under the case reduces the effective interior space in the memory card, which is undesirable due to the constant need for memory cards of increased capacity. The present invention addresses and overcomes these drawbacks by providing a memory card construction wherein a case of the memory card is provided with an internal reinforcement structure which effectively eliminates the need for an underlying layer of encapsulant material. These as well as other features and advantages of the present invention will be described in more detail below.

BRIEF SUMMARY OF THE INVENTION

In accordance with the present invention, there is provided multiple embodiments of a memory card, each embodiment including a case which is cooperatively engaged to a module comprising at least a printed circuit board having an electronic circuit device mounted thereto. In each embodiment of the present invention, the case is reinforced by a stiffener which effectively increases the mechanical strength of the fully fabricated memory card, thus providing the capability to withstand typical bending and twisting tests. The stiffener may be provided in any one of a plurality of different shapes or profiles, and may be embedded within one or more of various locations within the case.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
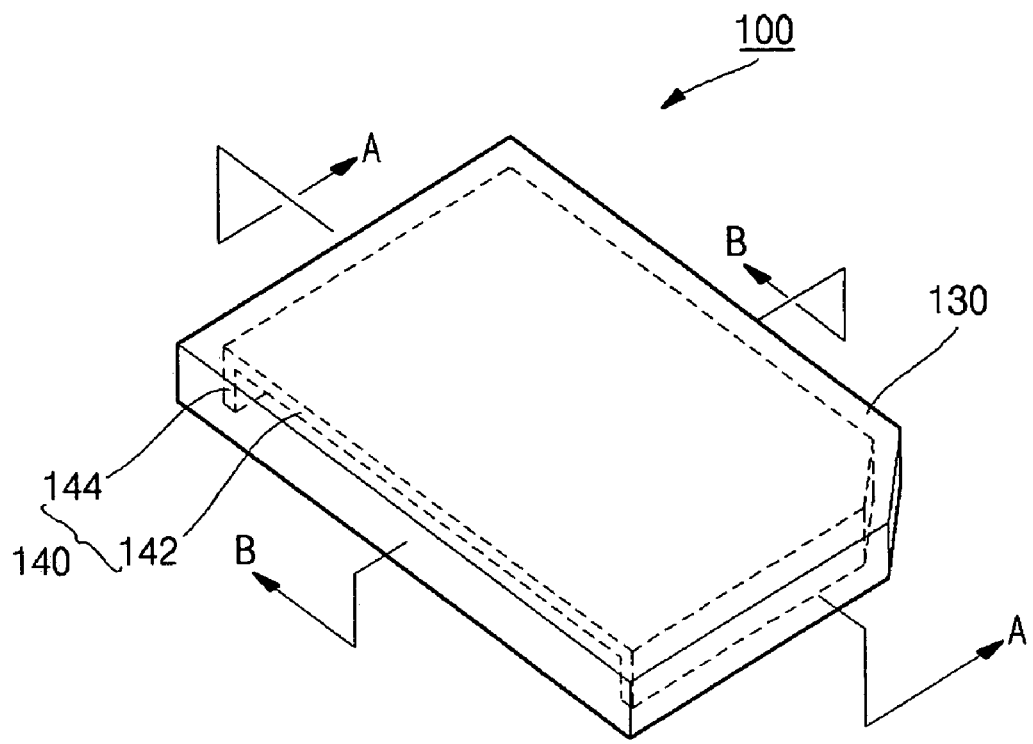
FIG. 1A is a top perspective view of a memory card constructed in accordance with a first embodiment of the present invention.
Figure 1B:
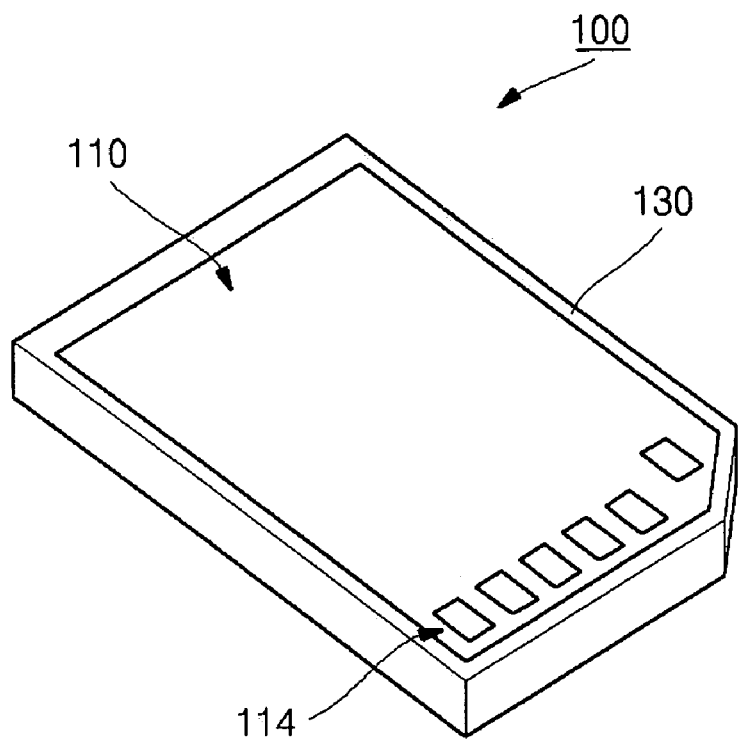
FIG. 1B is a bottom perspective view of the memory card shown in FIG. 1A.

Referring now to the drawings wherein the showings are for purposes of illustrating preferred embodiments of the present invention only, and not for purposes of limiting the same, FIGS. 1A-1D depict a memory card 100 constructed in accordance with a first embodiment of the present invention. The memory card 100, as well as the memory cards of other embodiments of the present invention which will be described in more detail below, may be a multi-media card (MMC), a reduced size multi-media card (RSMMC), or a secure digital (SD) card. Additionally, though the memory card 100 and those memory cards of the other embodiments described below are each an SMT type memory card, those of ordinary skill in the art will recognize that the features of the present invention are equally applicable to COB type memory cards as well.

The memory card 100 comprises a circuit board 110, which itself includes an insulative layer 113 defining a generally planar lower surface 111 and an opposed, generally planar upper surface 112. Formed on the lower surface 111 of the insulative layer 113 in close proximity to one of the peripheral edge segments thereof is a plurality of input/output (I/O) pads 114. Formed on the upper surface 112 of the insulative layer 113 is a conductive pattern (not shown) which is placed into electrical communication with the I/O pads 114 on the lower surface 111 through a conductive medium (not shown) formed through and/or upon the insulative layer 113. Such conductive medium may include conductive vias which extend through the insulative layer 113, conductive traces which extend along the upper and lower surfaces 112, 111 of the insulative layer 113, or combinations thereof. The circuit board 110 can be a hardened printed circuit board, a flexible printed circuit board, or any equivalent thereto, the present invention not being restricted to any particular type of circuit board 110.

Mounted to the upper surface 112 of the insulative layer 113 of the circuit board 110 is an electronic circuit device 120. As best seen in FIG. 1C, the electronic circuit device 120 comprises a semiconductor package 121 (which itself includes an internal semiconductor die) and various passive components 122, 123 such as a resistor and a condenser. As depicted, the passive components 122, 123 are each mounted to the upper surface 112 through the use of an adhesive 128, and are electrically connected to the conductive pattern formed on the upper surface 112. The semiconductor package 121 is itself mounted to the upper surface 112 and electrically connected to the conductive pattern thereon through the use of the conductive leads 125 of the semiconductor package 121. As will be recognized, the conductive pattern of the circuit board 110 may be used to facilitate the placement of the components 121, 122, 123 of the electronic circuit device 120 into electrical communication with each other in any desired pattern or arrangement, and into electrical communication with the I/O pads 114 in any desired pattern or arrangement. Those of ordinary skill in the art will further recognize that the type, number and arrangement of the components 121, 122, 123 included in the electronic circuit device 120 as shown in FIG. 1C is exemplary only, in that only one component or multiple components of any type may be mounted and electrically connected to the circuit board 110 in any number, combination or pattern depending on the desired application for the memory card 100. All that is necessary is that the circuit board 110 be configured to facilitate the electrical communication between any component(s) and the I/O pads 114 in a prescribed manner. For example, the electronic circuit device 120 can comprise only a semiconductor package and/or a semiconductor die without any passive component(s). Along these lines, the number of I/O pads 114 included in the circuit board 110 is also variable, in that the number of such I/O pads 114 may be varied according to the particular application for the memory card 100.

In the memory card 100, the electronic circuit device 120 is not covered or encapsulated by a layer of encapsulant material. As a result, the circuit board 110, and in particular the insulative layer 113 thereof, does not need to be sized so as to provide a prescribed space or area for accommodating the encapsulant material and the resultant, hardened encapsulation part. Thus, the circuit board 110 can be fabricated in a relatively small size, the required space or area defined by the upper surface 112 thereof being limited to that which is needed to accommodate the electronic circuit device 120 alone, as opposed to the combination of the electronic circuit device 120 and a hardened encapsulation part. Since the circuit board 110 represents a considerable portion of the material cost of the memory card 100, the effective reduction in the size of the circuit board 110 facilitates a corresponding reduction in the cost of the memory card 100.

The memory card 100 of the first embodiment further comprises a case 130 which is mounted to the circuit board 110. The case 130 has a plate-like shape of predetermined thickness, and defines a recess 134 which is sized and configured to accommodate the electronic circuit device 120 mounted to the upper surface 112 of the circuit board 110 when the circuit board 110 is advanced into the lower portion of the recess 134 in the manner shown in FIG. 1C. More particularly, a peripheral portion of the upper surface 112 of the insulative layer 113 extending along the peripheral edge thereof is secured to a stepped portion or shoulder 135 defined by the case 130 through the use of a layer of adhesive 129. The case 130 is sized relative to the circuit board 110 such that when the insulative layer 113 is secured to the shoulder 135 via the adhesive layer 129 in the above-described manner, the generally planar rim 132 of the case 130 extends in substantially co-planar relation to the first surface 111 of the insulative layer 113. As will be recognized, the thickness of the side walls of the case 130 can be increased as needed to provide the memory card 100 with an overall shape or profile of certain dimensions or proportions, despite a reduction in the size of the circuit board 110. Additionally, those of ordinary skill in the art will recognize that the recess 134 can be provided in any one of a multiplicity of differing shapes, the sole requirement being that the shape of the recess 134 correspond to and be able to accommodate the configuration of the circuit board 110 and electronic circuit device 120 mounted thereto.

Figure 1C:
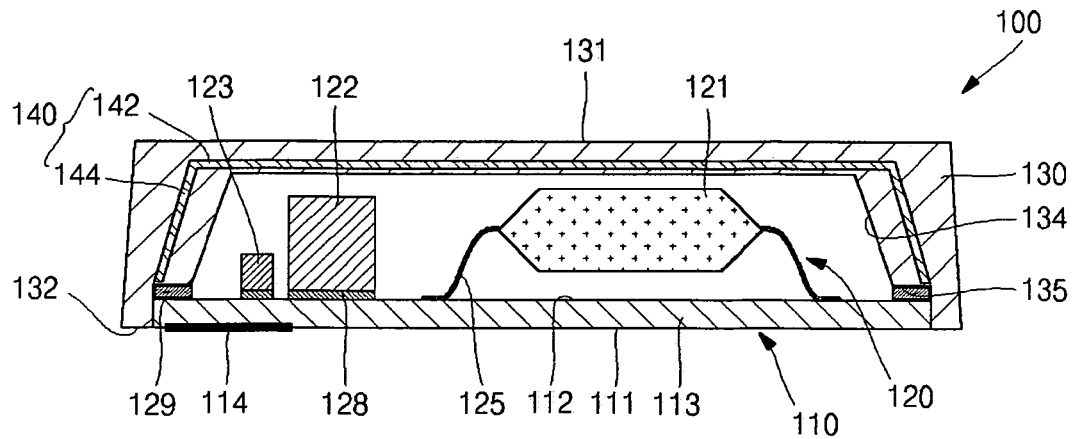
FIG. 1C is a cross-sectional view taken along line A-A of FIG. 1A.
Figure 1D:
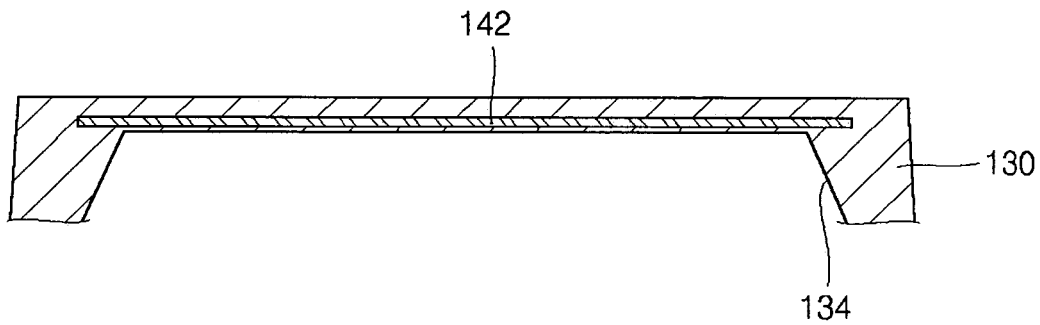
FIG. 1D is a partial cross-sectional view taken along line B-B of FIG. 1A.

As seen in FIGS. 1A, 1C, and 1D, the case 130 of the memory card 100 includes an internal stiffener 140. The stiffener 140 has a shape corresponding to that of the case 130, and is disposed in the interior thereof. More particularly, the stiffener 140 includes an upper plate 142 which extends within the upper portion 131 of the case 130. In addition to the upper plate 142, the stiffener 140 includes an opposed pair of side plates 144 which extend along respective ones of an opposed pair of sides edges of the upper plate 142. More particularly, as seen in FIGS. 1A and 1C, one of the side plates 144 extends along the leading edge of the case 130 which is disposed closest to the I/O pads 114, with the remaining side plate 144 extending along the opposite trailing edge of the case 130. Though the side plates 144 and the upper plate 142 are preferably integrally connected to each other, it is contemplated that the side plates 144 may comprise separate components which are embedded in respective side walls of the case 130 in spaced relation to the upper plate 142.

As further seen in FIGS. 1A, 1C and 1D, the area of the upper plate 142 is smaller than the horizontal cross-sectional area of the case 130. Similarly, the areas of the side plates 144 are smaller than the vertical, cross-sectional width of the case 130 as viewed along the line B-B of FIG. 1A. The stiffener 140 is fabricated to be of predetermined thickness according to the mechanical strength required in the memory card 100, and is further sized so as not to be exposed in the case 130. The desirability of preventing the exposure of the stiffener 140 in the case 130 is particularly significant in those instances wherein the stiffener 140 is made of a conductive metal material. In this regard, any exposure to the conductive metal stiffener 140 to the inside of the recess 134 could potentially damage the electronic circuit device 120 residing in the recess 134, or could induce an electrical short. Further, any protrusion or exposure of a conductive metal stiffener 140 to the outside of the case 130 could result in the generation of an electrical short between the memory card 100 and an external device when the memory card 100 is inserted into such external device.

It is contemplated that the stiffener 140 can be fabricated of various materials, including a metal such as iron or aluminum, or a plastic which is of a strength stronger than the resin used to form the case 130. Those of ordinary skill in the art will recognize that the material of the stiffener 140 is not limited to these particular examples, with any one of various materials having a mechanical strength stronger than that of the case 130 being suitable for use in relation to the stiffener 140. Thus, the stiffener 140 can be formed of any suitable material according to the mechanical strength required in the memory card 100. Since the stiffener 140 is formed of a material having a mechanical strength stronger than the case 130, the stiffener 140 effectively increases the mechanical strength of the case 130. As a result, the mechanical strength of the memory card 100 is increased due to the stiffener 140, the memory card 100 therefore being able to satisfy a bending test or a twist test without a separate encapsulant layer being applied to the electronic circuit device 120 and located underneath the case 130 within the recess 134. Indeed, if the material of the stiffener 140 is properly selected, the memory card 100 may possess structural integrity greater than that required for passing a standard bending test or twist test.

The memory card 100, the circuit board 110 and the electronic circuit device 120 mounted to the upper surface 112 of the insulative layer 113 are collectively referred to as a "module." Since the inclusion of the stiffener 140 in the case 130 eliminates the need to encapsulate the module for the reasons described above, the memory card 110 can be produced more efficiently and economically. Other manufacturing economies are achieved by the elimination of the need to apply an encapsulant layer to the module, such economies also including greater ease in mass producing modules through the implementation of a sawing process.

Figure 2:
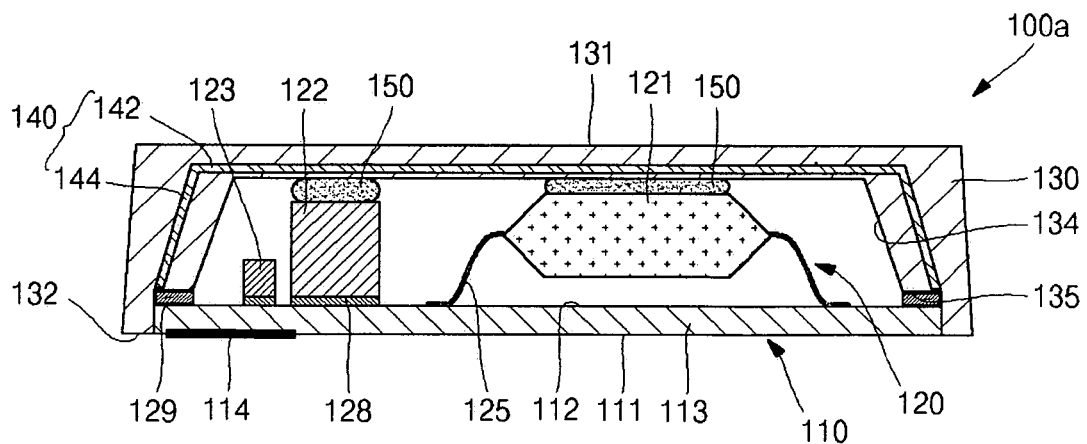
FIG. 2 is a cross-sectional view of a memory card constructed in accordance with a second embodiment of the present invention.

Referring now to FIG. 2, there is shown a memory card 100a constructed in accordance with a second embodiment of the present invention. The memory card 100a of the second embodiment bears substantial similarity in construction to the memory card 100 of the first embodiment, with the 100 series reference numerals in FIG. 2 being used to identify the same structures identified by the corresponding 100 series reference numerals included in FIGS. 1A-1D. In this regard, only the distinctions between the memory cards 100a, 100 will be discussed below.

In the memory card 100a, an adhesive layer 150 is coated onto the top surfaces of certain components of the electronic circuit device 120, and in particular the top surface of the semiconductor package 121 and the top surface of the passive component 122. The adhesive layer 150 is further bonded to the underside of the upper portion 131 of the case 130 which defines the innermost surface of the recess 134. Each adhesive layer 150 is preferably formed of a heat-conductive liquid glue so that the heat generated in the electronic circuit device 120 can be transferred to ambient air through the case 130 and the stiffener 140. Since those surfaces of the components 121, 122 to which the adhesive layers 150 are applied are generally planar, the flow of the liquid glue of the adhesive layer 150 is not hampered. Thus, if the liquid glue is sufficiently coated on such surfaces, the glue will flow substantially uniformly on such surfaces. Further, since the adhesive layers 150 eliminate the need for the use a film type of adhesive which is relatively expensive, the memory card 100a can be manufactured at a reduced cost.

Figure 3:
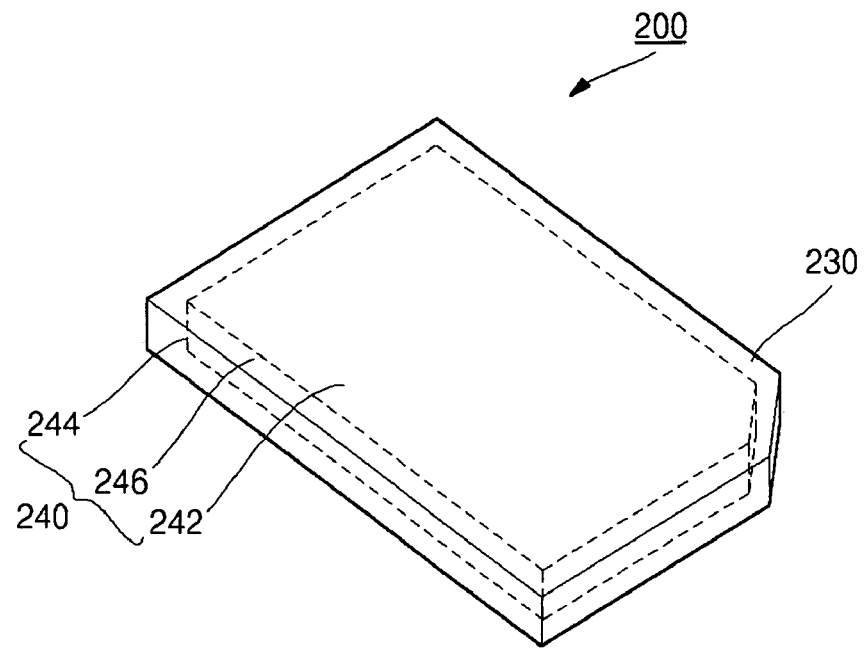
FIG. 3 is a top perspective view of a memory card constructed in accordance with a third embodiment of the present invention.

Referring now to FIG. 3, there is shown a memory card 200 constructed in accordance with a third embodiment of the present invention. The memory card 200 of the third embodiment also bears substantial similarity in construction to the memory card 100 of the first embodiment, with the 200 series reference numerals in FIG. 3 being used to identify the same structures identified by the corresponding 100 series reference numerals included in FIGS. 1A-1D. In this regard, only the distinctions between the memory cards 200, 100 will be discussed below.

In the memory card 200, the stiffener 240 has an upper plate 242 which, like the upper plate 142 described above, is embedded in the upper portion of the case 230. In addition to the upper plate 242, the stiffener 240 includes side plates 244 which are analogous to and disposed in the same orientations described above in relation to the side plates 144 of the stiffener 140. However, in addition to the side plates 244, the stiffener 240 also includes a pair of side plates 246 which are integrally connected to and extend along respective ones of the remaining two longitudinally extending peripheral edge segments of the upper plate 242. As a result, the stiffener 240 of the memory card 200 is substantially box-shaped and imparts increased mechanical strength to the memory card 200, thus effectively preventing the memory card 200 from being bent or twisted.

Figure 4A:
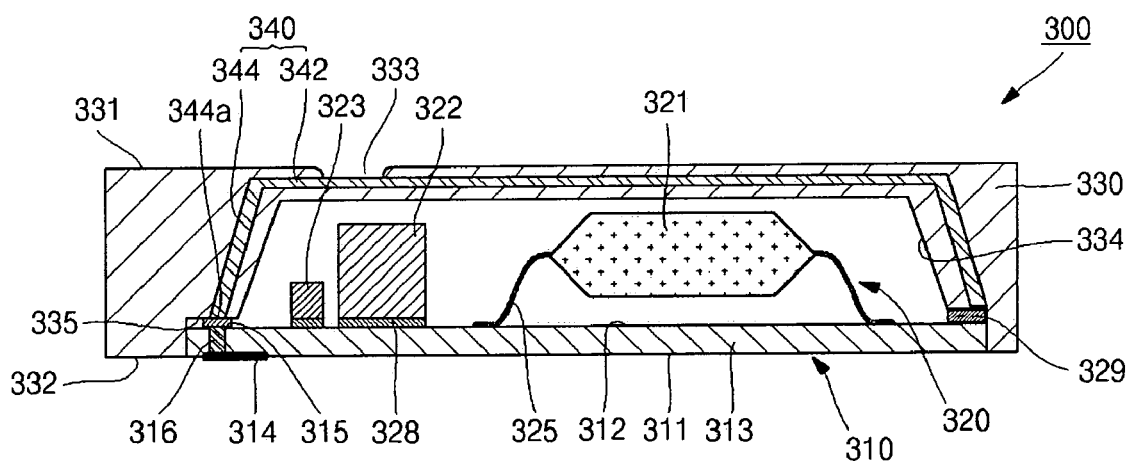
FIG. 4A is a cross-sectional view of a memory card constructed in accordance with a fourth embodiment of the present invention.
Figure 4B:
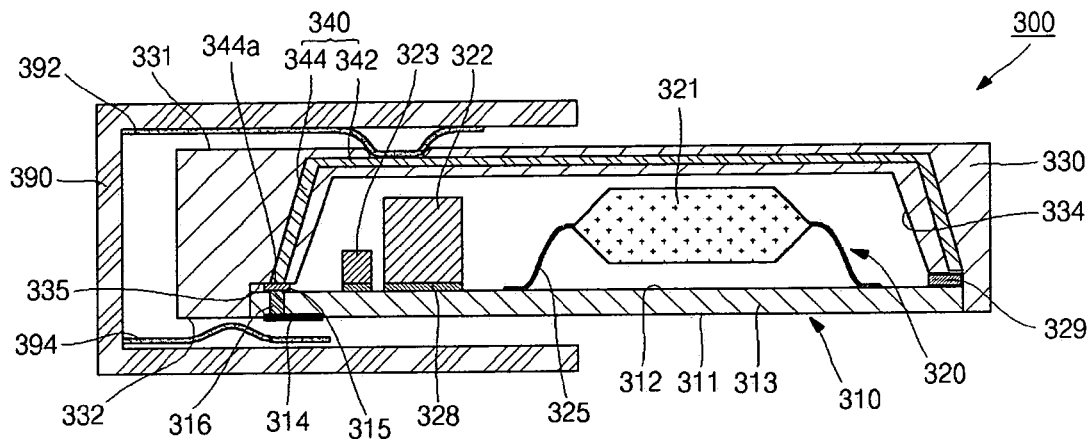
FIG. 4B is a cross-sectional view of the memory card of the fourth embodiment similar to that shown in FIG. 4A, but further illustrating the memory card as cooperatively engaged to an external device.

Referring now to FIGS. 4A and 4B, there is shown a memory card 300 constructed in accordance with a fourth embodiment of the present invention. The memory card 300 of the fourth embodiment also bears substantial similarity in construction to the memory card 100 of the first embodiment, with the 300 series reference numerals in FIGS. 4A and 4B being used to identify the same structures identified by the corresponding 100 series reference numerals included in FIGS. 1A-1D.

The memory card 300 comprises a circuit board 310, which itself includes an insulative layer 313 defining a generally planar lower surface 311 and an opposed, generally planar upper surface 312. Formed on the lower surface 311 of the insulative layer 313 in close proximity to one of the peripheral edge segments thereof is a plurality of input/output (I/O) pads, one of which comprises a ground pad 314. The remaining I/O pads are signal pads used for the input and output of electrical signals. When the memory card 300 is connected to an external device 390 (as shown in FIG. 4B), the ground pad 314 connects the ground of the memory card 300 to a ground line to the external device 390. Formed on the upper surface 312 of the insulative layer 313 is a conductive pattern (not shown) which is placed into electrical communication with the I/O pads on the lower surface 311 through a conductive medium (not shown) formed through and/or upon the insulative layer 313. Such conductive medium may include conductive vias which extend through the insulative layer 313, conductive traces which extend along the upper and lower surfaces 312, 311 of the insulative layer 313, or combinations thereof. Also disposed on the upper surface 312 of the insulative layer 313 is a conductive pad 315. The pad 315 is electrically connected to the conductive pattern, and is further electrically connected to the ground pad 314 by a conductive via 316 which extends through the insulative layer 313 of the circuit board 310. The circuit board 310 can be a hardened printed circuit board, a flexible printed circuit board, or any equivalent thereto, the present invention not being restricted to any particular type of circuit board 310.

Mounted to the upper surface 312 of the insulative layer 313 of the circuit board 310 is an electronic circuit device 320. As best seen in FIG. 4A, the electronic circuit device 320 comprises a semiconductor package 321 (which itself includes an internal semiconductor die) and various passive components 322, 323 such as a resistor and a condenser. As depicted, the passive components 322, 323 are each mounted to the upper surface 312 through the use of an adhesive 328, and are electrically connected to the conductive pattern formed on the upper surface 312. The semiconductor package 321 is itself mounted to the upper surface 312 and electrically connected to the conductive pattern thereon through the use of the conductive leads 325 of the semiconductor package 321. As will be recognized, the conductive pattern of the circuit board 310 may be used to facilitate the placement of the components 321, 322, 323 of the electronic circuit device 320 into electrical communication with each other in any desired pattern or arrangement, and into electrical communication with the I/O pads in any desired pattern or arrangement. Those of ordinary skill in the art will further recognize that the type, number and arrangement of the components 321, 322, 323 included in the electronic circuit device 320 as shown in FIG. 4A is exemplary only, in that only one component or multiple components of any type may be mounted and electrically connected to the circuit board 310 in any number, combination or pattern depending on the desired application for the memory card 300. All that is necessary is that the circuit board 310 be configured to facilitate the electrical communication between any component(s) and the I/O pads in a prescribed manner.

The memory card 300 further comprises a case 330 which is mounted to the circuit board 310. The case 330 defines a recess 334 which is sized and configured to accommodate the electronic circuit device 320 mounted to the upper surface 312 of the circuit board 310 when the circuit board 310 is advanced into the lower portion of the recess 334 in the manner shown in FIG. 4A. More particularly, a peripheral portion of the upper surface 312 of the insulative layer 313 extending along the peripheral edge thereof is secured to a stepped portion or shoulder 335 defined by the case 330 through the use of a layer of adhesive 329. The case 330 is sized relative to the circuit board 310 such that when the insulative layer 313 is secured to the shoulder 335 via the adhesive layer 329 in the above-described manner, the generally planar rim 332 of the case 330 extends in substantially co-planar relation to the first surface 311 of the insulative layer 313. As will be recognized, the thickness of the side walls of the case 330 can be increased as needed to provide the memory card 300 with an overall shape or profile of certain dimensions or proportions, despite a reduction in the size of the circuit board 310. Additionally, those of ordinary skill in the art will recognize that the recess 334 can be provided in any one of a multiplicity of differing shapes, the sole requirement being that the shape of the recess 334 correspond to and be able to accommodate the configuration of the circuit board 310 and electronic circuit device 320 mounted thereto.

The memory card 300 also includes an internal stiffener 340. In the memory card 300, the stiffener 340 is fabricated from a conductive metal such as iron, copper or aluminum. The stiffener 340 has a shape corresponding to that of the case 330. More particularly, the stiffener 340 includes an upper plate 342 which is formed and extends within the upper portion 331 of the case 330. As seen in FIG. 4A, a portion of the upper plate 342 of the stiffener 340 is exposed in a window or recess 333 formed in the upper portion 331 of the case 330. The recess 333 is preferably formed in a location which is closer to the leading edge of the case 330 (which is disposed closest to the I/O pads) than to the trailing edge thereof. In addition to the upper plate 342, the stiffener 340 includes an opposed pair of side plates 344 which are integrally connected to and extend along respective ones of an opposed pair of sides edges of the upper plate 342. More particularly, as seen in FIGS. 4A and 4B, one of the side plates 344 extends along the leading edge of the case 330, with the remaining side plate 344 extending along the opposite trailing edge of the case 330. In the memory card 300, portions of the side plates 344 are exposed in the shoulder 335 defined by the case 330. In this regard, the side plate 344 which extends along the leading edge of the case 330 includes a lower, distal end 344a which is disposed in electrical contact with the conductive pad 315 of the circuit board 310.

As seen in FIG. 4B, the memory card 300 is inserted into the external device 390, and is electrically connected to the external device 390 in order to transmit and receive signals. A ground line 392 is formed at an upper portion of the external device 390, with a signal line 394 being formed at a lower portion of the external device 390. The ground line 392 is disposed closer to the entrance port or inlet of the external device 390 than is the signal line 394. As such, when the memory card 300 is inserted or advanced into the external device 390, the ground pad 314 of the I/O pads of the circuit board 310 is electrically connected to the ground line 392 of the external device 390 first. More particularly, when the memory card 300 is inserted into the external device 390, the ground line 392 makes direct, electrical contact with the stiffener 340, and more particularly to that portion of the upper plate 342 which is exposed in upper recess 333 of the case 330. Since the stiffener 340 is electrically connected to the ground pad 314 by the pad 315 and conductive via 316, the ground pad 314 of the memory card 300 is thus electrically connected to the ground line 392 of the external device 390. Therefore, in the process in which the memory card 300 is inserted into external device 390, since any static electricity is discharged to the external device 390 through the ground pad 314 and the ground line 392, and at least one of the I/O pads comprising a signal pad is electrically connected to the signal line 394, the memory card 300 is prevented from being damaged by static electricity.

Figure 5A:
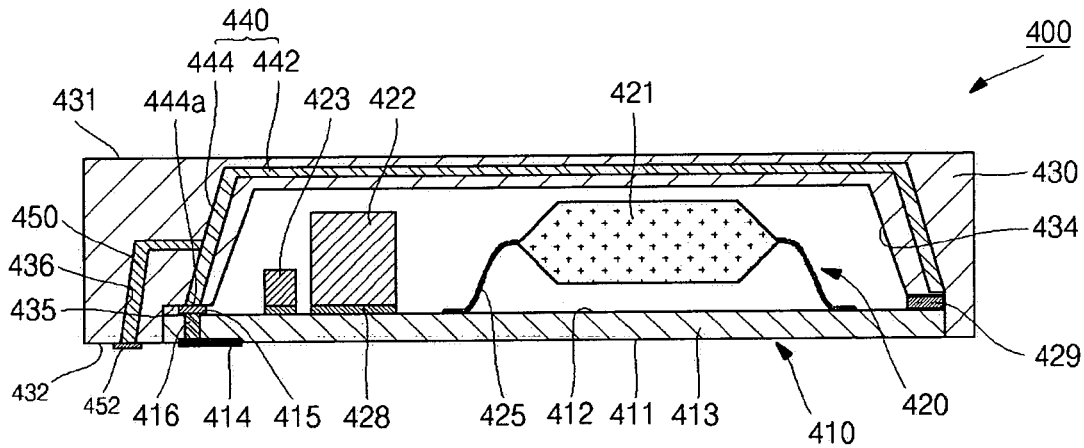
FIG. 5A is cross-sectional view of a memory card constructed in accordance with a fifth embodiment of the present invention.
Figure 5B:
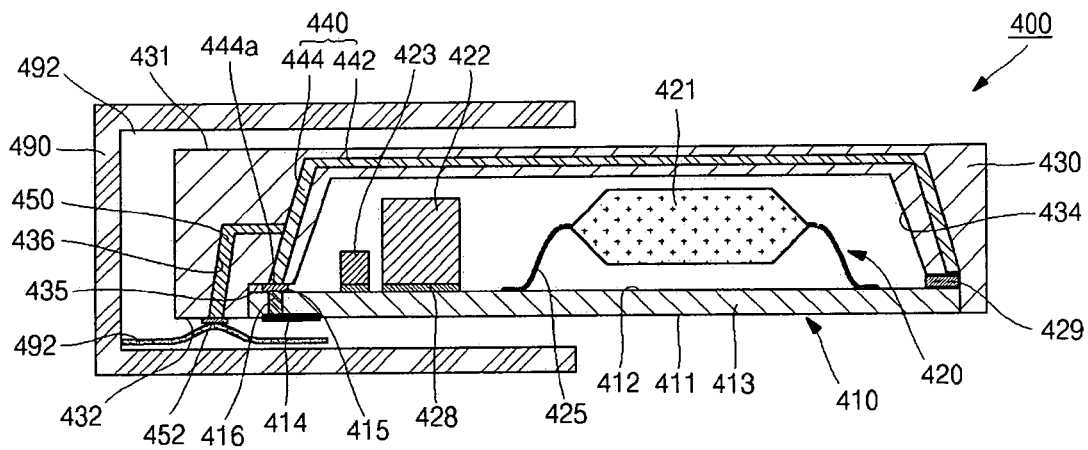
FIG. 5B is a cross-sectional view of the memory card of the fifth embodiment similar to that shown in FIG. 5A, but further illustrating the memory card as cooperatively engaged to an external device.

Referring now to FIGS. 5A and 5B, there is shown a memory card 400 constructed in accordance with a fifth embodiment of the present invention. The memory card 400 of the fifth embodiment bears substantial similarity and construction to the memory card 300 of the fourth embodiment, with the 400 series reference numerals in FIGS. 5A and 5B being used to identify the same structures identified by the corresponding 300 series reference numerals in FIGS. 4A and 4B. In this regard, only the distinctions between the memory cards 400, 300 will be discussed below.

The case 430 of the memory card 400 is mounted to the circuit board 410 thereof. The case 430 defines a recess 434 which is sized and configured to accommodate the electronic circuit device 420 mounted to the upper surface 412 of the circuit board 410 when the circuit board 410 is advanced into the lower portion of the recess 434 in the manner shown in FIG. 5A. More particularly, a peripheral portion of the upper surface 412 of the insulative layer 413 extending along the peripheral edge thereof is secured to a stepped portion or shoulder 435 defined by the case 430 through the use of a layer of adhesive 429. The case 430, and in particular the shoulder 435 defined thereby, is sized relative to the circuit board 410 such that when the insulative layer 413 is secured to the shoulder 435 via the adhesive layer 429 in the above-described manner, the generally planar rim 432 of the case 430 extends in substantially co-planar relation to the first surface 411 of the insulative layer 413. Moreover, the shoulder 435 overlaps the pad 415 of the circuit board 410. As will be recognized, the thickness of the side walls of the case 430 can be increased as needed to provide the memory card 400 with an overall shape or profile of certain dimensions or proportions, despite a reduction in the size of the circuit board 410. Additionally, those of ordinary skill in the art will recognize that the recess 434 can be provided in any one of a multiplicity of differing shapes, the sole requirement being that the shape of the recess 434 correspond to and be able to accommodate the configuration of the circuit board 410 and electronic circuit device 420 mounted thereto.

The case 430 of the memory card 400 further includes a penetration hole 436 which is formed between the recess 434 and the leading edge of the case 430. As seen in FIG. 5A, one end of the penetration hole 436 extends to the rim 432 of the case 430. The opposite end of the penetration hole 436 extends to the stiffener 440 of the memory card 400, and in particular to the side plate 444 of the stiffener 440 which extends along the leading edge of the case 430.

The internal stiffener 440 of the memory card 400 is fabricated from a conductive metal such as iron, copper or aluminum, and has a shape corresponding to that of the case 430. The upper plate 442 of the stiffener 440 is formed and extends within the upper portion 431 of the case 430. The opposed pair of side plates 444 of the stiffener 440 are integrally connected to and extend along respective ones of an opposed pair of sides edges of the upper plate 442. As indicated above, one of the side plates 444 extends along the leading edge of the case 430. The remaining side plate 444 extends along the opposite trailing edge of the case 430. In the memory card 400, portions of the side plates 444 are exposed in the shoulder 435 defined by the case 430. In this regard, the side plate 444 which extends along the leading edge of the case 430 includes a lower, distal end 444a which is disposed in electrical contact with the conductive pad 415 of the circuit board 410.

Disposed within the penetration hole 436 of the case 430 is a connecting terminal 450 which is fabricated from a conductive metal material. One end of the connecting terminal 450 is electrically connected to the stiffener 430, and more particularly to the side plate 444 thereof which extends along the leading edge of the case 430. The opposite end of the connecting terminal 450 extends to the rim 432 of the case 430, and is electrically connected to a terminal pad 452 which is formed on the rim 432 in close proximity to the leading edge of the case 430 as seen in FIG. 5A.

As seen in FIG. 5B, the memory card 400 is inserted into the external device 490, and is electrically connected to the external device 490 in order to transmit and receive signals. A ground line 492 and a signal line (not shown) are each formed at a lower portion of the external device 490. When the memory card 400 is inserted or advanced into the external device 490, the terminal pad 452 is electrically connected to the ground line 492 of the external device 490 first. Since the stiffener 440 is electrically connected to the terminal pad 452 by the connecting terminal 450, the ground pad 414 of the memory card 400 is thus electrically connected to the ground line 492 of the external device 490 by the conductive via 416, the pad 415, the stiffener 440, the connecting terminal 450 and the terminal pad 452. Therefore, in the process in which the memory card 400 is inserted into external device 490, since any static electricity is discharged to the external device 490 through the ground pad 414 and the ground line 492 before any one of the I/O pads comprising a signal pad is electrically connected to a signal line of the external device 490, the memory card 400 is prevented from being damaged by static electricity.

Figure 6:
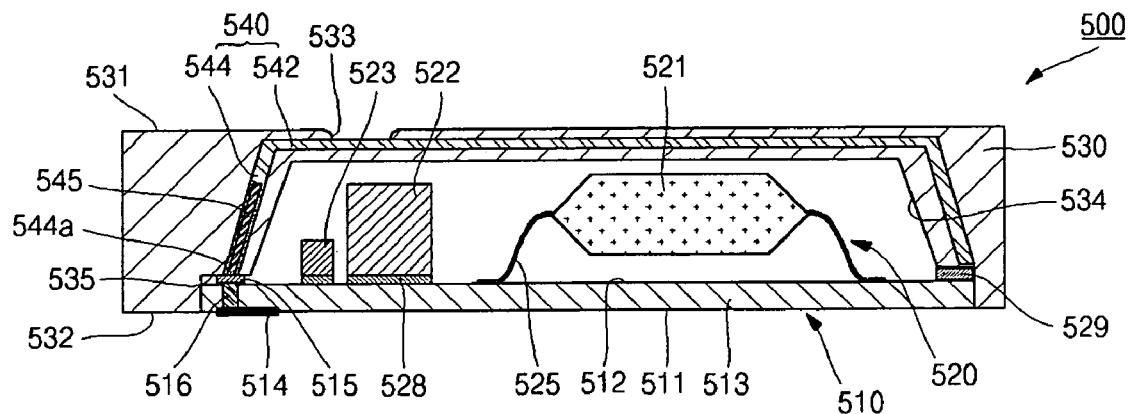
FIG. 6 is a cross-sectional view of a memory card constructed in accordance with a sixth embodiment of the present invention.

Referring now to FIG. 6, there is shown a memory card 500 constructed in accordance with a sixth embodiment of the present invention. The memory card 500 of the sixth embodiment also bears substantial similarity in construction to the memory card 300 of the fourth embodiment, with the 500 series reference numerals in FIG. 6 being used to identify the same structures identified by the corresponding 300 series reference numerals included in FIGS. 4A and 4B. In this regard, only the distinctions between the memory cards 500, 300 will be discussed below.

In the memory card 500, the internal stiffener 540 of the case 530 is fabricated from a conductive metal such as iron, copper or aluminum. The stiffener 540 has a shape corresponding to that of the case 530. More particularly, the stiffener 540 includes an upper plate 542 which is formed and extends within the upper portion 531 of the case 530. As seen in FIG. 6, a portion of the upper plate 542 of the stiffener 540 is exposed in the recess 533 formed in the upper portion 531 of the case 530. The recess 533 is preferably formed in a location which is closer to the leading edge of the case 530 (which is disposed closest to the I/O pads) than to the trailing edge thereof. In addition to the upper plate 542, the stiffener 540 includes an opposed pair of side plates 544 which are integrally connected to and extend along respective ones of an opposed pair of sides edges of the upper plate 542. One of the side plates 544 extends along the leading edge of the case 530, with the remaining side plate 544 extending along the opposite trailing edge of the case 530. In the memory card 500, portions of the side plates 544 are exposed in the shoulder 535 defined by the case 530. In this regard, the side plate 544 which extends along the leading edge of the case 530 includes a lower, distal end 544a which is disposed adjacent the conductive pad 515 of the circuit board 310. Disposed within the side plate 544 which extends along the leading edge of the case 530 is a resilient member 545 which preferably comprises a spring. The resilient member 545 is itself fabricated from a conductive metal such as iron, copper or aluminum. A predetermined portion of the resilient member 545 protrudes from the distal end 544a of the corresponding side plate 544.

When the circuit board 510 of the memory card 500 is advanced into the lower portion of the recess 534 of the case 530 in the manner shown in FIG. 6, a peripheral portion of the upper surface 512 of the insulative layer 513 extending along the peripheral edge thereof is secured to the shoulder 535 defined by the case 530 through the use of the layer of adhesive 529. Upon the insulative layer 513 being secured to the shoulder 535 via the adhesive layer 529, the generally planar rim 532 of the case 530 extends in substantially co-planar relation to the first surface 511 of the insulative layer 513, with the resilient member 545 (and hence the stiffener 540) being in electrical contact with the conductive pad 515 of the circuit board 510 which is itself electrically connected to the ground pad 514 by the via 516. Advantageously, the inclusion of the resilient member 545 in the side plate 544 provides firm electrical contact between the stiffener 540 and the pad 515 of the circuit board 510, thus substantially ensuring electrical communication between the ground pad 514 and the ground line of the external device when the memory card 500 is inserted into the external device, and preventing the memory card 500 from being damaged by static electricity.

Figure 7A:
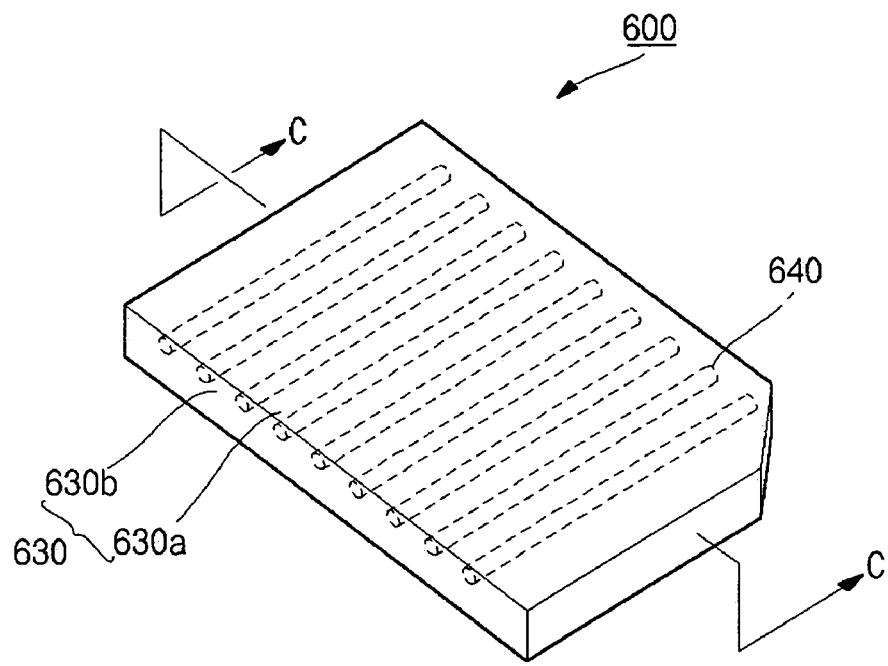
FIG. 7A is a top perspective view of a memory card constructed in accordance with a seventh embodiment of the present invention.
Figure 7B:
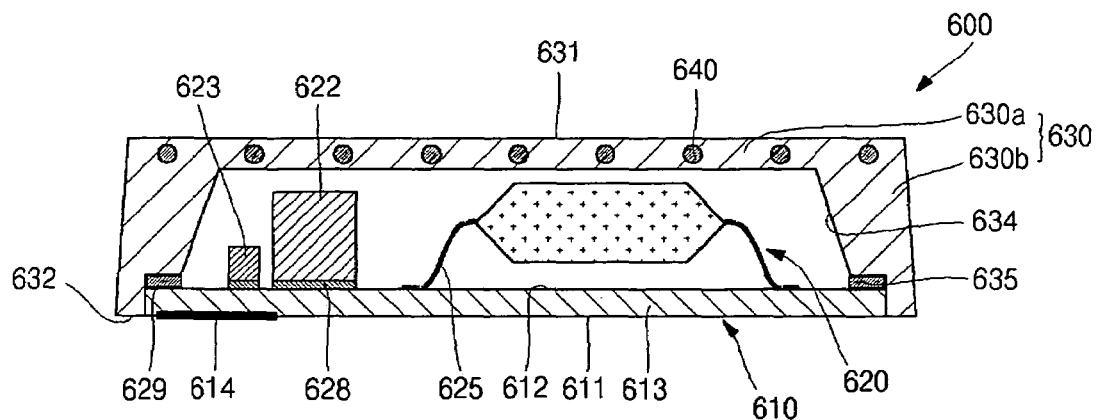
FIG. 7B is a cross-sectional view taken along line C-C of FIG. 7A.

Referring now to FIGS. 7A and 7B, there is shown a memory card 600 constructed in accordance with a seventh embodiment of the present invention. The memory card 600 of the seventh embodiment bears substantial similarity in construction to the memory card 100 of the first embodiment, with the 600 series reference numerals in FIGS. 7A and 7B being used to identify the same structures identified by the corresponding 100 series reference numerals included in FIGS. 1A-1D. In this regard, only the distinctions between the memory cards 600, 100 will be discussed below.

The memory card 600 comprises a case 630 which is mounted to the circuit board 610. The case 630 includes an upper plate 630a which defines the upper portion 631 thereof, and multiple side plates 630b which are integrally connected to the upper plate 630a. The case 630 also has a plate-like shape of predetermined thickness, and defines a recess 634 which is sized and configured to accommodate the electronic circuit device 620 mounted to the upper surface 612 of the circuit board 610 when the circuit board 610 is advanced into the lower portion of the recess 634 in the manner shown in FIG. 7B. More particularly, the peripheral portion of the upper surface 612 of the insulative layer 613 extending along the peripheral edge thereof is secured to the shoulder 635 defined by the case 630 through the use of the layer of adhesive 629. The case 630 is sized relative to the circuit board 610 such that when the insulative layer 613 is secured to the shoulder 635 via the adhesive layer 629 in the above-described manner, the generally planar rim 632 of the case 630 (which is defined by the side plates 630b) extends in substantially co-planar relation to the first surface 611 of the insulative layer 613. As will be recognized, the thickness of the side plates 630b of the case 630 can be increased as needed to provide the memory card 600 with an overall shape or profile of certain dimensions or proportions, despite a reduction in the size of the circuit board 610. Additionally, those of ordinary skill in the art will recognize that the recess 634 can be provided in any one of a multiplicity of differing shapes, the sole requirement being that the shape of the recess 634 correspond to and be able to accommodate the configuration of the circuit board 610 and electronic circuit device 620 mounted thereto.

As further seen in FIGS. 7A and 7B, the case 630 of the memory card 600 includes an internal stiffener 640. The stiffener 640 comprises a plurality of elongate, cylindrically configured support bars which each have a generally circular cross-sectional configuration and are preferably of substantially equal length. The support bars are each embedded within the upper plate 630a of the case 630, and extend in spaced, generally parallel relation to each other and to the leading and trailing edges (i.e., the front and back side plates 630b) of the case 630. The spacing between the support bars is preferably at predetermined intervals. It is contemplated that the support bars of the stiffener 640 can be fabricated of various materials, including a metal such as an iron alloy, a copper alloy, a nickel alloy or an aluminum alloy, or a plastic which is of a strength stronger than the resin used to form the case 630. Those of ordinary skill in the art will recognize that the material of the stiffener 640 is not limited to these particular examples, with any one of various materials having a mechanical strength stronger than that of the case 630 being suitable for use in relation to the stiffener 640. Thus, the stiffener 640 can be formed of any suitable material according to the mechanical strength required in the memory card 600. Since the stiffener 640 is formed of a material having a mechanical strength stronger than the case 630, the stiffener 640 effectively increases the mechanical strength of the case 630. As a result, the mechanical strength of the memory card 600 is increased due to the stiffener 640, the memory card 600 therefore being able to satisfy a bending test or a twist test without a separate encapsulant layer being applied to the electronic circuit device 620 and located underneath the case 630 within the recess 634.

In the memory card 600, the lengths of the support bars of the stiffener 640 are less than the width of the upper plate 630a (i.e., the distance between the outer surfaces of the longitudinally extending sides plates 630b of the case 630 extending generally perpendicularly from the trailing edge or back side plate 630b), with the diameters of the support bars being less than the thickness of the upper plate 630a as seen in FIG. 7B. As a result, the support bars are not exposed in the case 630, and in particular the upper plate 630a thereof. The desirability of preventing the exposure of the stiffener 640 in the case 630 is particularly significant in those instances wherein the stiffener 640 is made of a conductive metal material. In this regard, any exposure to the conductive metal stiffener 640 to the inside of the recess 634 could potentially damage the electronic circuit device 620 residing in the recess 634, or could induce an electrical short. Further, any protrusion or exposure of a support bar of the stiffener 640 to the outside of the case 630 could result in the generation of an electrical short between the memory card 600 and an external device when the memory card 600 is inserted into such external device, or could impede the ability to insert the memory card into the external device.

It is further contemplated that the support bars of the stiffener 640 can be fabricated to be of shapes differing from the generally cylindrical shape shown in FIGS. 7A and 7B, and may be provided in a number differing from the nine depicted. For example, the support bars may have quadrangular or triangular cross-sectional configurations, or may be provided in combinations of various configurations. The sole requirement is that the support bars of the stiffener 640 are sized relative to the upper plate 630a so as not to be exposed therein for the reasons discussed above. Moreover, the case 630 may alternatively be fabricated such that the support bars of the stiffener 640 extend in spaced, generally parallel relation to the longitudinally extending side plates 630b of the case 630 extending generally perpendicularly from the trailing edge or back side plate 630b, as opposed to extending in generally perpendicular relation to such longitudinally extending sides plates 630b.

Figure 8:
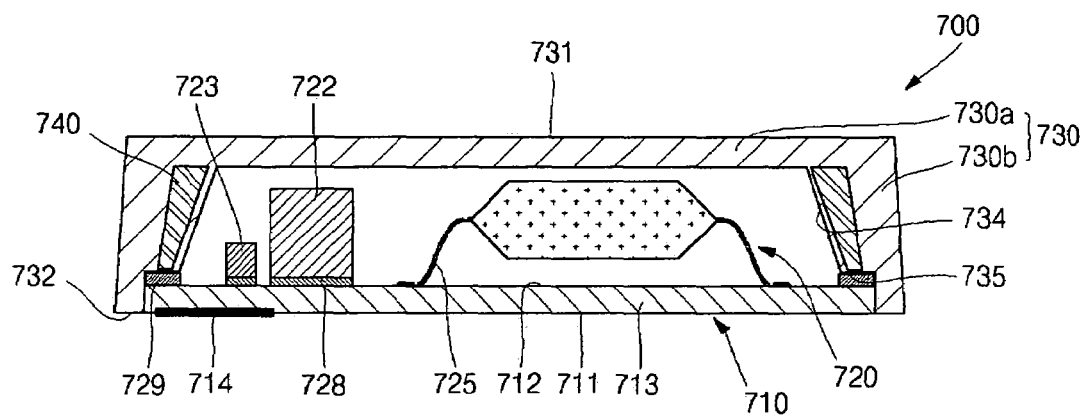
FIG. 8 is a cross-sectional view of a memory card constructed in accordance with an eighth embodiment of the present invention.

Referring now to FIG. 8, there is shown a memory card 700 constructed in accordance with a eighth embodiment of the present invention. The memory card 700 of the eighth embodiment bears similarity in construction to the memory card 600 of the seventh embodiment, with the 700 series reference numerals in FIG. 8 being used to identify the same structures identified by the corresponding 600 series reference numerals included in FIGS. 7A and 7B. In this regard, only the distinctions between the memory cards 700, 600 will be discussed below.

As seen in FIG. 8, the case 730 of the memory card 700 includes an internal stiffener 740. The stiffener 740 comprises at least two support bars of predetermined size and shape which are each embedded within respective ones of the front and back side plates 730b of the case 730. It is contemplated that the support bars of the stiffener 740 can be fabricated of any suitable material having a mechanical strength stronger than the case 730 so as effectively increases the mechanical strength of the case 730.

In the memory card 700, the support bars of the stiffener 740 each preferably have a column like shape with a cross-sectional configuration generally corresponding to that of the front and back side plates 730b of the case 730 in which they are embedded. In this regard, the width of the each of the support bars of the stiffener 740 is less than the width of the upper plate 730a (i.e., the distance between the outer surfaces of the longitudinally extending sides plates 730b of the case 730 extending generally perpendicularly from the trailing edge or back side plate 730b) such that the support bars are not exposed in the case 730, and in particular the outer surfaces of any of the side plates 730b thereof.

It is contemplated that the support bars of the stiffener 740 can be fabricated to be of shapes differing from that shown in FIG. 8. The sole requirement is that the support bars of the stiffener 740 are sized relative to the case 730 so as not to be exposed therein. Moreover, the case 730 may alternatively be fabricated such that an additional two support bars of the stiffener 740 are embedded within respective ones of the longitudinally extending side plates 730b of the case 730 extending generally perpendicularly from the trailing edge or back side plate 730b.

Figure 9:
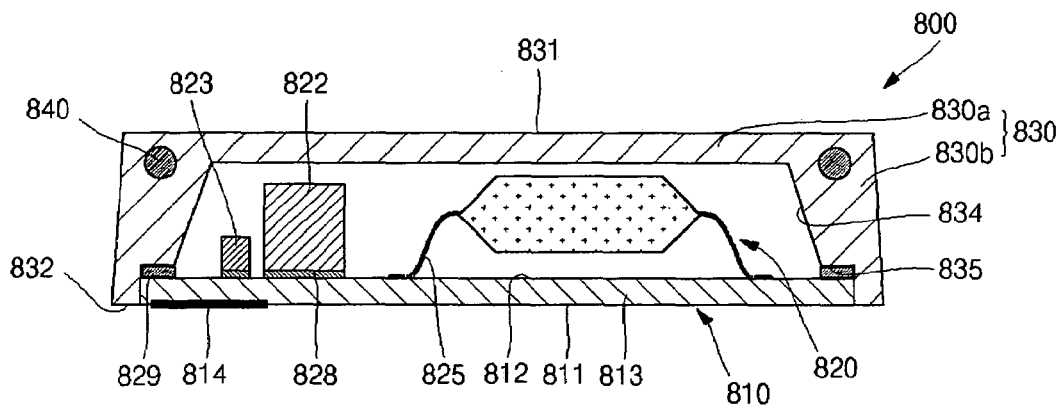
FIG. 9 is a cross-sectional view of a memory card constructed in accordance with a ninth embodiment of the present invention.

Referring now to FIG. 9, there is shown a memory card 800 constructed in accordance with a ninth embodiment of the present invention. The memory card 800 of the ninth embodiment bears similarity in construction to the memory card 700 of the eighth embodiment, with the 800 series reference numerals in FIG. 9 being used to identify the same structures identified by the corresponding 700 series reference numerals included in FIG. 8. In this regard, only the distinctions between the memory cards 800, 700 will be discussed below.

As seen in FIG. 9, the case 830 of the memory card 800 includes an internal stiffener 840. The stiffener 840 comprises at least two support bars of predetermined size and shape which are each partially embedded within respective ones of the front and back side plates 830b of the case 830. The support bars of the stiffener 840 are each further partially embedded with the upper plate 830a of the case 830. As such, the support bars generally reside and extend within those portions of the case 830 which define the junction between the upper plate 830a and side plates 830b. It is contemplated that the support bars of the stiffener 840 can be fabricated of any suitable material having a mechanical strength stronger than the case 830 so as effectively increases the mechanical strength of the case 830.

In the memory card 800, the support bars of the stiffener 840 each preferably have a generally cylindrical shape with a generally circular cross-sectional configuration. The width of the each of the support bars of the stiffener 840 is less than the width of the upper plate 830a (i.e., the distance between the outer surfaces of the longitudinally extending sides plates 830b of the case 830 extending generally perpendicularly from the trailing edge or back side plate 830b), with the diameter being sized such that, based on the width thereof, the support bars are not exposed in the case 830.

It is contemplated that the support bars of the stiffener 840 can be fabricated to be of shapes differing from that shown in FIG. 8. For example, the support bars may have quadrangular or triangular cross-sectional configurations, or may be provided in combinations of various configurations. The sole requirement is that the support bars of the stiffener 840 are sized relative to the case 830 so as not to be exposed therein. Moreover, the case 830 may alternatively be fabricated such that an additional two support bars of the stiffener 840 are embedded in the case 830 within the junction between the upper plate 830*a* and respective ones of the longitudinally extending sides plates 830*b* extending generally perpendicularly from the trailing edge or back side plate 830*b*.

Figure 10:
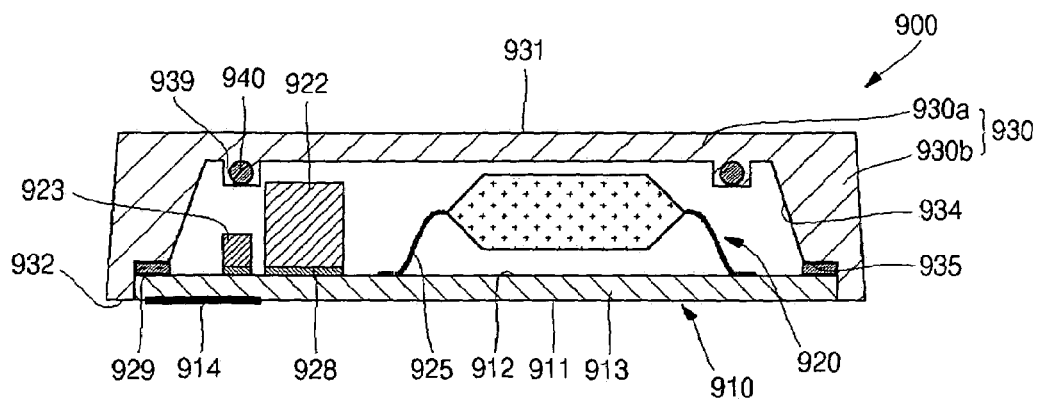
FIG. 10 is a cross-sectional view of a memory card constructed in accordance with a tenth embodiment of the present invention.

Referring now to FIG. 10, there is shown a memory card 900 constructed in accordance with a tenth embodiment of the present invention. The memory card 900 of the tenth embodiment bears similarity in construction to the memory card 800 of the ninth embodiment, with the 900 series reference numerals in FIG. 10 being used to identify the same structures identified by the corresponding 800 series reference numerals included in FIG. 9. In this regard, only the distinctions between the memory cards 900, 800 will be discussed below.

As seen in FIG. 10, the upper portion 931 of the case 930 includes an integral pair of elongate, bar-like protrusions 939 which extend along the underside thereof in spaced, generally parallel relation to each other and to the front and back side plates 930*b* of the case 930. As such, the protrusions 939 reside in the recess 934 defined by the case 930. Each of the protrusions 939 has a generally quadrangular cross-sectional configuration, and is formed to be of a prescribed height which is adapted not to interfere with the electronic circuit device 920 when the circuit board 910 is attached to the case 930 (i.e., the peripheral portion of the upper surface 912 of the insulative layer 913 extending along the peripheral edge thereof is secured to the shoulder 935 defined by the case 930 through the use of the layer of adhesive 929). The protrusions 939 are further sized to span the width of the recess 934, and are spaced from each other at a predetermined interval.

The memory card 900 also includes an internal stiffener 940. The stiffener 940 comprises at least two support bars of predetermined size and shape which are each embedded and extend within a respective one of the protrusions 939. Though not shown in FIG. 10, it is contemplated that the support bars of the stiffener 940 may be sized so as to extend slightly into the upper plate 930*a* of the case 930. It is contemplated that the support bars of the stiffener 940 can be fabricated of any suitable material having a mechanical strength stronger than the case 930 so as effectively increases the mechanical strength of the case 930.

In the memory card 900, the support bars of the stiffener 940 each preferably have a generally cylindrical shape with a generally circular cross-sectional configuration. The width of the each of the support bars of the stiffener 940 is less than the width of the upper plate 930*a* (i.e., the distance between the outer surfaces of the longitudinally extending sides plates 930*b* of the case 930 extending generally perpendicularly from the trailing edge or back side plate 930*b*), with the diameter being sized such that, based on the width thereof, the support bars are not exposed in the case 930.

It is contemplated that the support bars of the stiffener 940 can be fabricated to be of shapes differing from that shown in FIG. 10. For example, the support bars may have quadrangular or triangular cross-sectional configurations, or may be provided in combinations of various configurations. The sole requirement is that the support bars of the stiffener 940 are sized relative to the case 930 so as not to be exposed therein. Moreover, the case 930 may alternatively be fabricated such that more than two protrusions 939 and corresponding support bars of the stiffener 940 are included therein.

Figure 11:
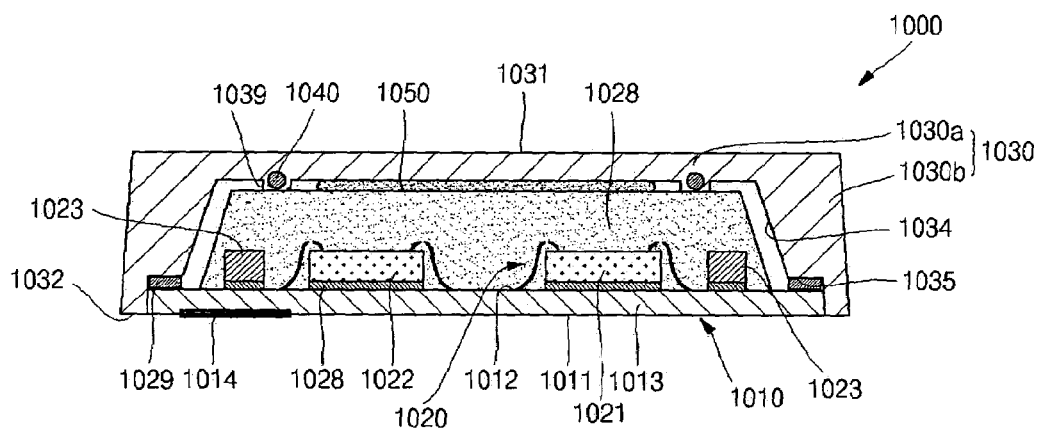
FIG. 11 is a cross-sectional view of a memory card constructed in accordance with an eleventh embodiment of the present invention.

Referring now to FIG. 11, there is shown a memory card 1000 constructed in accordance with an eleventh embodiment of the present invention. The memory card 1000 of the eleventh embodiment bears similarity in construction to the memory card 900 of the tenth embodiment, with the 1000 series reference numerals in FIG. 11 being used to identify the same structures identified by the corresponding 900 series reference numerals included in FIG. 10. In this regard, only the distinctions between the memory cards 900, 800 will be discussed below.

As seen in FIG. 11, in the memory card 1000, the electronic circuit device 1020 attached to the upper surface 1012 of the insulative layer 1013 of the circuit board 1010 is covered by a body 1028 formed of a hardened layer of an encapsulant material. The upper portion 1031 of the case 1030 includes an integral pair of elongate, bar-like protrusions 1039 which extend along the underside thereof in spaced, generally parallel relation to each other and to the front and back side plates 1030*b* of the case 1030. Each of the protrusions 1039 has a generally quadrangular cross-sectional configuration, and is formed to be of a prescribed height which is sized such that the outermost, distal surfaces of the protrusions 1039 contact the generally planar top surface of the body 1028 when the circuit board 1010 is attached to the case 1030 (i.e., the peripheral portion of the upper surface 1012 of the insulative layer 1013 extending along the peripheral edge thereof is secured to the shoulder 1035 defined by the case 1030 through the use of the layer of adhesive 1029) in the manner shown in FIG. 11. The protrusions 1039 are further sized to span the width of the recess 1034, and are spaced from each other at a predetermined interval.

In the memory card 1000, an adhesive layer 1050 is coated onto the top surface of the body 1028. The adhesive layer 1050 is further bonded to the underside of the upper portion 1031 of the case 1030 which defines the innermost surface of the recess 1034. The adhesive layer 1050 is preferably formed of a liquid glue. Since that surface of the body 1028 to which the adhesive layer 1050 is applied is generally planar, the flow of the liquid glue of the adhesive layer 1050 is not hampered. Thus, if the liquid glue is sufficiently coated on such surface, the glue will flow substantially uniformly thereon. Further, since the adhesive layer 1050 eliminates the need for the use a film type of adhesive which is relatively expensive, the memory card 1000 can be manufactured at a reduced cost.

The memory card 1000 also includes an internal stiffener 1040. The stiffener 1040 comprises at least two support bars of predetermined size and shape which are each embedded and extend within a respective one of the protrusions 1039. As shown in FIG. 11, the support bars of the stiffener 1040 may be sized so as to extend slightly into the upper plate 1030*a* of the case 1030. It is contemplated that the support bars of the stiffener 1040 can be fabricated of any suitable material having a mechanical strength stronger than the case 1030 so as effectively increases the mechanical strength of the case 1030.

In the memory card 1000, the support bars of the stiffener 1040 each preferably have a generally cylindrical shape with a generally circular cross-sectional configuration. The width of the each of the support bars of the stiffener 1040 is less than the width of the upper plate 1030*a* (i.e., the distance between the outer surfaces of the longitudinally extending sides plates 1030*b* of the case 1030 extending generally perpendicularly from the trailing edge or back side plate 1030*b*), with the diameter being sized such that, based on the width thereof, the support bars are not exposed in the case 1030.

It is contemplated that the support bars of the stiffener 1040 can be fabricated to be of shapes differing from that shown in FIG. 11. For example, the support bars may have quadrangular or triangular cross-sectional configurations, or may be provided in combinations of various configurations. The sole requirement is that the support bars of the stiffener 1040 are sized relative to the case 1030 so as not to be exposed therein. Moreover, the case 1030 may alternatively be fabricated such that more than two protrusions 1039 and corresponding support bars of the stiffener 1040 are included therein.

Figure 12:
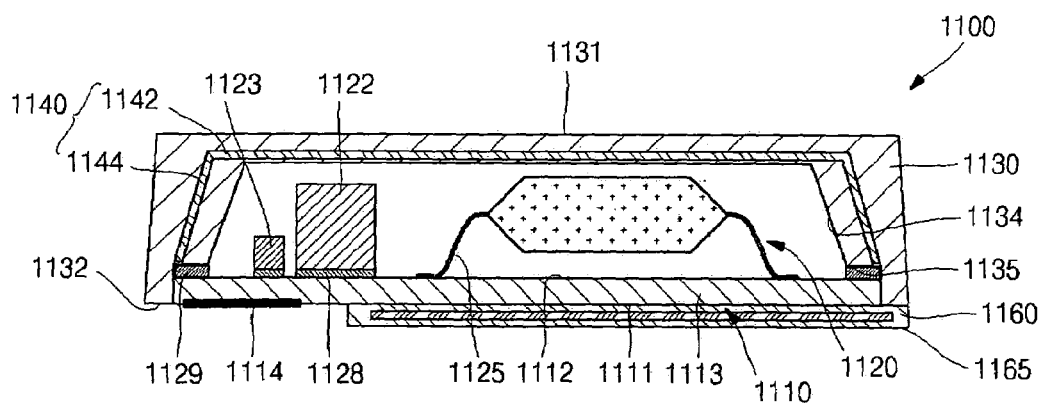
FIG. 12 is a cross-sectional view of a memory card constructed in accordance with a twelfth embodiment of the present invention.

Referring now to FIG. 12, there is shown a memory card 1100 constructed in accordance with a twelfth embodiment of the present invention. The memory card 1100 of the twelfth embodiment bears substantial similarity in construction to the memory card 100 of the first embodiment, with the 1100 series reference numerals in FIG. 12 being used to identify the same structures identified by the corresponding 100 series reference numerals included in FIGS. 1A-1D. In this regard, only the distinctions between the memory cards 100*a*, 100 will be discussed below.

In the memory card 1100, in addition to the case 1130 being secured to the circuit board 1110, a cover 1160 is secured to the circuit board 1110 as well. As seen in FIG. 12, the cover 1160 has a substantially plate-like shape, and includes a second stiffener 1165 embedded therein. The cover 1160 is preferably formed of a material which is the same or similar to that used to fabricate the case 1130, and is bonded and fixed to portions of the lower rim 1132 of the case 1130 and the lower surface 1111 of the insulative layer 1113 of the circuit board 1110. Thus, the cover 1160 prevents at least a portion of the circuit board 1110 from being exposed in the completed memory card 1100. Thus, the cover 1160 assists in preventing any damage to the circuit board 1110 during use of the memory card 1100.

The second stiffener 1165 itself has a substantially plate-like shape which is complementary to that of the cover 1160, but is sized having an area less than that of the cover 1160 so as not to be exposed in the cover 1160 when embedded therein. The second stiffener 1165 is also formed of a material having a strength stronger than that of the cover 1160, and preferably the same material used to form the stiffener 1140 embedded within the case 1130. As will be recognized, the second stiffener 1165 reinforces the strength of the cover 1160, thereby reinforcing the strength of the memory card 1100.

Figure 13:
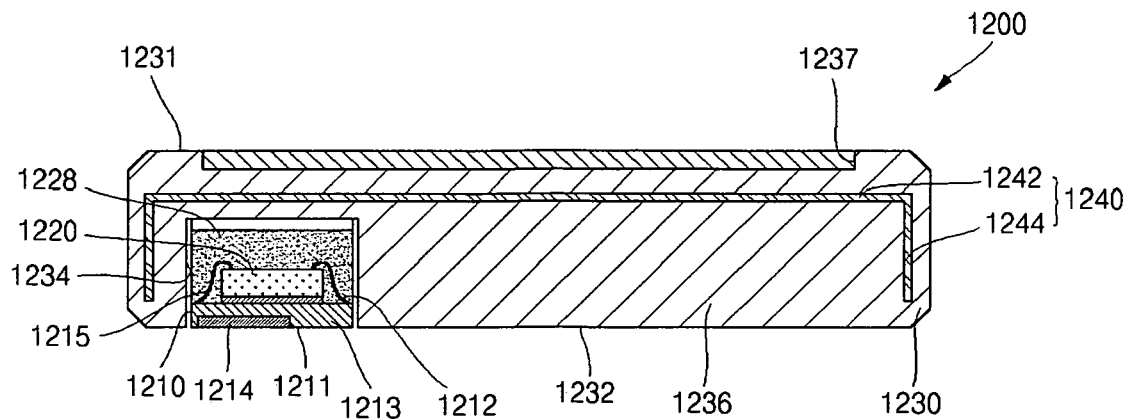
FIG. 13 is a cross-sectional view of a memory card constructed in accordance with a thirteenth embodiment of the present invention.

Referring now to FIG. 13, there is shown a memory card 1200 constructed in accordance with a thirteenth embodiment of the present invention. Many of the components included in the memory card 1200 are the same as those included in the memory card 100 of the first embodiment, with the 1200 series reference numerals included in FIG. 13 being used to identify the same structures identified by the corresponding 100 series reference numerals included in FIGS. 1A-1D.

The memory card 1200 shown in FIG. 13 is commonly referred to as a chip array land grid array MMC (CALGA MMC). The circuit board 1210 of the memory card 1200 includes an insulative layer 1213 having opposed, generally planar lower and upper surfaces 1211, 1212. Performed on the lower surface 1211 along one of the peripheral edge segments defined by the insulative layer 1213 is a plurality of I/O pads 1214. Formed on the upper surface 1212 of the insulative layer 1213 is a conductive pattern (not shown) which is placed into electrical communication with the I/O pads 1214 on the lower surface 1211 through a conductive medium (not shown) formed through and/or upon the insulative layer 1213. Such conductive medium may include conductive vias which extend through the insulative layer 1213, conductive traces which extend along the upper and lower surfaces 1212, 1211 of the insulative layer 1213, or combinations thereof.

Mounted to the upper surface 1212 of the insulative layer 1213 of the circuit board 1210 is an electronic circuit device 1220. The electronic circuit device 1220 is electrically connected to the conductive pattern of the circuit board 1210 through the use of conductive wires 1215. Additionally, the electronic circuit device 1220 is covered or encapsulated by a body 1228 formed from a layer of a hardened encapsulant material. The circuit board 1210, electronic circuit device 1220, wires 1215 and body 1228 collectively form a module of the memory card 1200.

The memory card 1200 further includes a case 1230 which has a block-like shape of predetermined thickness and area. The case 1230 includes a lower surface 1232 and an upper surface which is defined by the upper portion 1231 of the case 1230. As shown in FIG. 13, formed in the upper surface defined by the upper portion 1231 of the case 1230 is a recess 1237 which is sized and configured to accommodate a label. Formed in the lower surface 1232 of the case 1230 in close proximity to one of the side surfaces thereof is a recess 1234 which is sized and configured to accommodate the above-described module. In this regard, the depth of the recess 1234 is preferably sized such that the lower surface 1211 of the insulative layer 1213 of the circuit board 1210 is substantially flush or continuous with the lower surface 1232 of the case 1230 when the module is fully inserted into the recess 1234. Since the module is offset toward the front side or leading edge of the case 1230, a solid portion 1236 of the case 1230 is defined between the module and the backside or trailing edge of the case 1230.

In the memory card 1200, the case 1230 is typically formed of an organic material such as plastic, and thus is relatively weak and generally incapable of passing a bending or memory card twist test. To alleviate this problem, embedded in the case 1230 is a stiffener 1240. The stiffener 1240 includes an upper plate 1242 which extends within the upper portion 1231 of the case 1230. In addition to the upper plate 1242, the stiffener 1240 includes an opposed pair of side plates 1244 which extend along respective ones of an opposed pair of side edges of the upper plate 1242. More particularly, as seen in FIG. 13, one of the side plates 1244 extends along the leading edge of the case 1230, with the remaining side plate 1244 extending along the opposite trailing edge of the case 1230. The stiffener 1240 is sized relative to the case 1230 such that no portion of the stiffener 1240 is exposed in the case 1230. Due to the inclusion of the stiffener 1240 in the case 1230, the strength of the memory card 1200 is substantially improved, thus rising to a level sufficient to satisfy typical bending test and twist test requirements.

Figure 14:
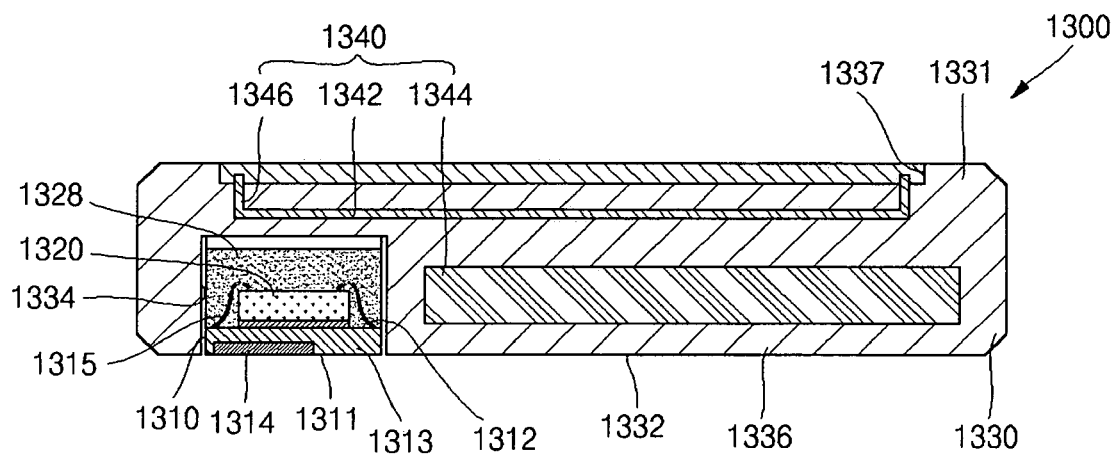
FIG. 14 is a cross-sectional view of a memory card constructed in accordance with a fourteenth embodiment of the present invention.

Referring now to FIG. 14, there is shown a memory card 1300 constructed in accordance with a fourteenth embodiment of the present invention. The memory card 1300 of the fourteenth embodiment bears substantial similarity in construction to the memory card 1200 of the thirteenth embodiment, with the 1300 series reference numerals in FIG. 14 being used to identify the same structures identified by the corresponding 1200 series reference numerals included in FIG. 13. In this regard, only the distinctions between the memory cards 1300, 1200 will be discussed below.

In the memory card 1300, the stiffener 1340 comprises an upper stiffener 1342 which is formed in the interior of the upper portion 1331 of the case 1330, and a lower stiffener 1344 which is formed in the interior of the lower, solid portion 1336 of the case 1330 extending between the backside or trailing edge of the case 1330 and the recess 1334. The upper stiffener 1342 has a plate-like configuration, and is of a thickness which is less than the distance separating the upper surface of the case 1330 defined by the upper portion 1331 thereof from the recess 1334. As seen in FIG. 14, the upper stiffener 1342 may include upwardly extending flange portions 1346 which are used to effectively increase the strength/rigidity thereof. The lower stiffener 1344 has a substantially block-like shape, and is embedded within the solid portion 1336 of the case 1330 described above. The lower stiffener 1344 is separated from the upper stiffener 1342 by a predetermined distance, and extends in generally parallel relation to the upper stiffener 1342.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A memory card comprising:
   a circuit board having at least one I/O pad formed thereon;
   at least one electronic circuit device mounted to the circuit board and electrically connected to the I/O pad;
   a case including a generally planar upper portion and at least opposed front and back side walls which are integrally connected to the upper portion, the case being operatively connected to the circuit board in a manner covering the electronic circuit device; and
   a stiffener comprising an upper plate which extends within the upper portion of the case and defines at least two sides, and at least two side plates which extend along respective ones of the sides of the upper plate and within respective ones of the front and back side walls of the case, the stiffener being operative to increase the mechanical strength of the case.

2. The memory card of claim 1 wherein:
   the upper plate defines multiple sides; and
   a plurality of side plates extend along respective ones of each of the sides of the upper plate.

3. The memory card of claim 2 wherein the side plates are integrally connected to the upper plate.

4. The memory card of claim 1 wherein:
   the case is fabricated from a first material having a first mechanical strength; and
   the stiffener is fabricated from a second material having a second mechanical strength which exceeds the first mechanical strength of the first material.

5. The memory card of claim 1 further comprising an adhesive layer disposed between and contacting both the electronic circuit device and the case.

6. The memory card of claim 1 wherein the stiffener is formed of a conductive metal material.

7. The memory card of claim 6 wherein:
   the circuit board further includes a ground pad and a conductive pad which is electrically connected to the ground pad;
   the stiffener is electrically connected to the conductive pad; and
   the upper portion and side walls of the case collectively define a recess having a portion of the stiffener exposed therein.

8. The memory card of claim 7 wherein the stiffener includes a conductive resilient member which is sized and configured to maintain firm contact with the conductive pad.

9. The memory card of claim 8 wherein the conductive resilient member is a spring.

10. The memory card of claim 6 wherein:
    the circuit board further includes a ground pad and a conductive pad which is electrically connected to the ground pad;
    the stiffener is electrically connected to the conductive pad; and
    the case includes a terminal pad formed thereon which is electrically connected to the stiffener by a conductive connecting terminal which is embedded within the case.

11. A memory card comprising:
    a circuit board having at least one I/O pad formed thereon;
    at least one electronic circuit device mounted to the circuit board and electrically connected to the I/O pad;
    a case including a generally planar upper portion and at least opposed front and back side walls which are integrally connected to the upper portion, the case being operatively connected to the circuit board in a manner covering the electronic circuit device; and
    a stiffener comprising at least two elongate bars embedded in the case in spaced relation to each other, the stiffener being operative to increase the mechanical strength of the case.

12. The memory card of claim 11 wherein:
    the bars are embedded in the upper portion of the case.

13. The memory card of claim 11 wherein:
    the bars are embedded in respective ones of the front and back side walls of the case.

14. The memory card of claim 11 wherein:
    the front and back side walls of the case are integrally connected to the upper portion of the case at respective ones of first and second plate junctions; and
    the support bars are embedded in respective ones of the first and second plate junctions.

15. The memory card of claim 11 wherein:
    the case further includes at least two protrusions formed on and extending along the upper portion thereof in spaced relation to each other; and
    the bars are embedded and extend within respective ones of the protrusions.

16. The memory card of claim 15 wherein:
    the electronic circuit device is covered by a body of a hardened encapsulant material; and
    an adhesive layer is disposed between and contacts the body and the upper plate of the case.

17. The memory card of claim 1 further comprising a cover attached to predetermined portions of the case and the circuit board, the cover including a second stiffener embedded therein.

18. The memory card of claim 1, wherein:
    the circuit board further includes at least one ground pad formed thereon;
    the electronic circuit device is electrically connected to the ground pad;

the stiffener is electrically connected to the ground pad; and a conductive connecting terminal is embedded in the case and includes a portion which is exposed therein, the conductive connecting terminal being electrically connected to the stiffener.

19. A memory card comprising:

a circuit board having at least one I/O pad formed thereon;

at least one electronic circuit device mounted to the circuit board and electrically connected to the I/O pad;

a case including a generally planar upper portion and at least opposed front and back side walls which are integrally connected to the upper portion, each of the side walls defining an inner surface which extends angularly relative to the upper portion, the case being operatively connected to the circuit board so as cover the electronic circuit device while being maintained in spaced relation thereto; and a stiffener embedded in the upper portion and in each of the side walls of the case, the stiffener being operative to increase the mechanical strength of the case.

20. A memory card comprising:

a circuit board having at least one I/O pad and at least one ground pad formed thereon;

at least one electronic circuit device mounted to the circuit board and electrically connected to the I/O pad;

a case operatively connected to the circuit board in a manner covering the electronic circuit device; and a stiffener embedded in the case and including at least first and second portions which are exposed therein, one of the exposed portions of the stiffener being electrically connected to the ground pad, the stiffener being operative to increase the mechanical strength of the case.

* * * * *